United States Patent
Lehtola

(10) Patent No.: US 12,003,268 B2
(45) Date of Patent: Jun. 4, 2024

(54) APPARATUS AND METHODS FOR POWER AMPLIFIER SIGNAL LIMITING

(71) Applicant: Skyworks Solutions, Inc., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 16 days.

(21) Appl. No.: 17/663,067

(22) Filed: May 12, 2022

(65) Prior Publication Data
US 2022/0385328 A1    Dec. 1, 2022

Related U.S. Application Data

(60) Provisional application No. 63/202,141, filed on May 28, 2021.

(51) Int. Cl.
*H04B 1/40* (2015.01)
*H03F 1/52* (2006.01)
*H03F 3/24* (2006.01)

(52) U.S. Cl.
CPC ............... *H04B 1/40* (2013.01); *H03F 1/52* (2013.01); *H03F 3/245* (2013.01); *H03F 2200/171* (2013.01); *H03F 2200/426* (2013.01); *H03F 2200/451* (2013.01)

(58) Field of Classification Search
CPC . H03G 11/04; H03F 1/0222; H03F 2200/105; H03F 2200/465; H03F 2200/171; H03F 2200/451; H03F 1/0211
See application file for complete search history.

(56) References Cited

U.S. PATENT DOCUMENTS

| | | | |
|---|---|---|---|
| 6,288,501 B1 * | 9/2001 | Nakamura | H05B 41/2886 315/307 |
| 6,822,511 B1 | 11/2004 | Doherty et al. | |
| 6,825,725 B1 | 11/2004 | Doherty et al. | |
| 6,882,220 B2 | 4/2005 | Doherty et al. | |
| 6,917,243 B2 | 7/2005 | Doherty et al. | |
| 7,193,474 B2 | 3/2007 | Phillips et al. | |
| 8,648,661 B1 | 2/2014 | Dolin | |
| 9,264,005 B1 * | 2/2016 | Cho | H03F 1/0222 |

(Continued)

OTHER PUBLICATIONS

SLAA71, "Digital RF Power Control for Power Amplifier Protection in Wireless Base-Stations", Application Report, Texas Instruments, Feb. 2017 (Year: 2017).*

*Primary Examiner* — Aristocratis Fotakis
(74) *Attorney, Agent, or Firm* — Knobbe, Martens, Olson & Bear, LLP

(57) ABSTRACT

Apparatus and methods for power amplifier signal limiting are disclosed. In certain embodiments, a power amplifier system includes a power amplifier that amplifies a radio frequency input signal, and a signal limiter operable to limit a signal power of the power amplifier when the radio frequency input signal exceeds a threshold. The signal limiter includes a radio frequency detector configured to generate a detection signal based on detecting a power level of the radio frequency input signal, and a latch configured to lock the signal limiter into an attenuating mode in response to the detection signal indicating that the threshold is exceeded.

20 Claims, 15 Drawing Sheets

(56) References Cited

U.S. PATENT DOCUMENTS

| | | |
|---|---|---|
| 9,602,060 B2 | 3/2017 | Gorbachov et al. |
| 9,673,853 B2 | 6/2017 | Blum |
| 9,755,587 B1 | 9/2017 | Arell |
| 10,084,417 B2 | 9/2018 | Blum |
| 10,177,721 B2 | 1/2019 | Arell |
| 10,211,197 B2 | 2/2019 | Quaglietta et al. |
| 10,284,153 B2 | 5/2019 | Quaglietta et al. |
| 10,505,501 B2 | 12/2019 | Gorbachov et al. |
| 2006/0099918 A1* | 5/2006 | Yamaguchi .......... H03C 3/0991 455/116 |
| 2009/0268917 A1* | 10/2009 | Croft, III .................. H04S 3/00 381/17 |
| 2015/0188505 A1* | 7/2015 | Saito ........................ H03F 3/19 330/279 |
| 2017/0214376 A1* | 7/2017 | Vetter .................... H03G 11/08 |
| 2017/0279415 A1* | 9/2017 | Wallis .................... H03F 3/213 |
| 2019/0131936 A1 | 5/2019 | Blum |
| 2019/0267953 A1 | 8/2019 | Arell |
| 2020/0127614 A1 | 4/2020 | Quaglietta et al. |
| 2020/0169334 A1* | 5/2020 | Li ........................... H03F 3/189 |
| 2021/0336594 A1* | 10/2021 | Benboudjema ...... H03G 1/0088 |
| 2022/0329206 A1* | 10/2022 | Seebacher ................ H03F 1/22 |

\* cited by examiner

APPARATUS AND METHODS FOR POWER AMPLIFIER SIGNAL LIMITING

CROSS-REFERENCE TO RELATED APPLICATIONS

This application claims the benefit of priority under 35 U.S.C. § 119 of U.S. Provisional Patent Application No. 63/202,141, filed May 28, 2021 and titled "APPARATUS AND METHODS FOR POWER AMPLIFIER SIGNAL LIMITING," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals. An RF communication system can be used to wirelessly communicate RF signals, which have a frequency in the range of 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a radio frequency input signal, and a front-end system including a power amplifier configured to amplify the radio frequency input signal, and a signal limiter operable to limit a signal power of the power amplifier when the radio frequency input signal exceeds a threshold. The signal limiter includes a radio frequency detector configured to generate a detection signal based on detecting a power level of the radio frequency input signal, and a latch configured to lock the signal limiter into an attenuating mode in response to the detection signal indicating that the threshold is exceeded.

In various embodiments, the transceiver is configured to generate the radio frequency input signal during a transmit frame, and in response to the detection signal indicating that the threshold is exceeded the latch is operable to lock the signal limiter into the attenuation mode for a reminder of the transmit frame. According to a number of embodiments, the power amplifier is biased by a bias signal that is activated during the transmit frame and deactivated during a receive frame, the latch selectively reset by the bias signal.

In several embodiments, the front-end system further includes an acoustic wave filter configured to filter a radio frequency output signal from the power amplifier, the acoustic wave filter protected by the signal limiter.

In some embodiments, wherein an input and an output of the signal limiter are both connected to an input of the power amplifier. According to a number of embodiments, wherein the signal limiter further includes an attenuator including a transistor, a resistor, and a capacitor in series between the input of the power amplifier and ground, the transistor activated in the attenuation mode.

In various embodiments, an input of the signal limiter is connected to an input of the power amplifier and an output of the signal limiter is connected to an output of the power amplifier. According to several embodiments, the signal limiter further includes an attenuator including a plurality of diodes connected in series between the output of the power amplifier and ground, the plurality of diodes including one or more selectable diodes that are bypassed in the attenuation mode.

In various embodiments, wherein the radio frequency detector includes a reference current source configured to generate a reference current that sets the threshold. According to a number of embodiments, the reference current source includes a trimming circuit operable to trim the reference current. In accordance with some embodiments, the reference current source is configured to generate the reference current with a positive temperature coefficient.

In certain embodiments, the present disclosure relates to a method of signal limiting in a mobile device. The method includes generating a radio frequency input signal using a transceiver, amplifying the radio frequency input signal using a power amplifier, and limiting a signal power of the power amplifier when the radio frequency input signal exceeds a threshold using a signal limiter, including generating a detection signal based on detecting a power level of the radio frequency input signal using a radio frequency detector of the signal limiter, and locking the signal limiter into an attenuating mode in response to the detection signal indicating that the threshold is exceeded using a latch of the signal limiter.

In some embodiments, the method further includes generating the radio frequency input signal during the transmit frame, and locking the signal limiter into the attenuation mode for a reminder of the transmit frame in response to the detection signal indicating that the threshold is exceeded.

In various embodiments, the method further includes biasing the power amplifier with a bias signal that is activated during the transmit frame and deactivated during a receive frame, and selectively resetting the latch with the bias signal.

In several embodiments, the method further includes filtering a radio frequency output signal from the power amplifier using an acoustic wave filter, and protecting the acoustic wave filter using the signal limiter.

In certain embodiments, the present disclosure relates to a power amplifier system. The power amplifier system includes a power amplifier configured to amplify a radio frequency input signal, and a signal limiter operable to limit a signal power of the power amplifier when the radio frequency input signal exceeds a threshold. The signal limiter includes a radio frequency detector configured to generate a detection signal based on detecting a power level of the radio frequency input signal, and a latch configured to lock the signal limiter into an attenuating mode in response to the detection signal indicating that the threshold is exceeded.

In some embodiments, the power amplifier is biased by a bias signal, the latch selectively reset by the bias signal.

In various embodiments, an input and an output of the signal limiter are both connected to an input of the power amplifier.

In several embodiments, an input of the signal limiter is connected to an input of the power amplifier and an output of the signal limiter is connected to an output of the power amplifier.

In some embodiments, the radio frequency detector includes a reference current source configured to generate a reference current that sets the threshold.

DETAILED DESCRIPTION OF EMBODIMENTS

Figure 1:
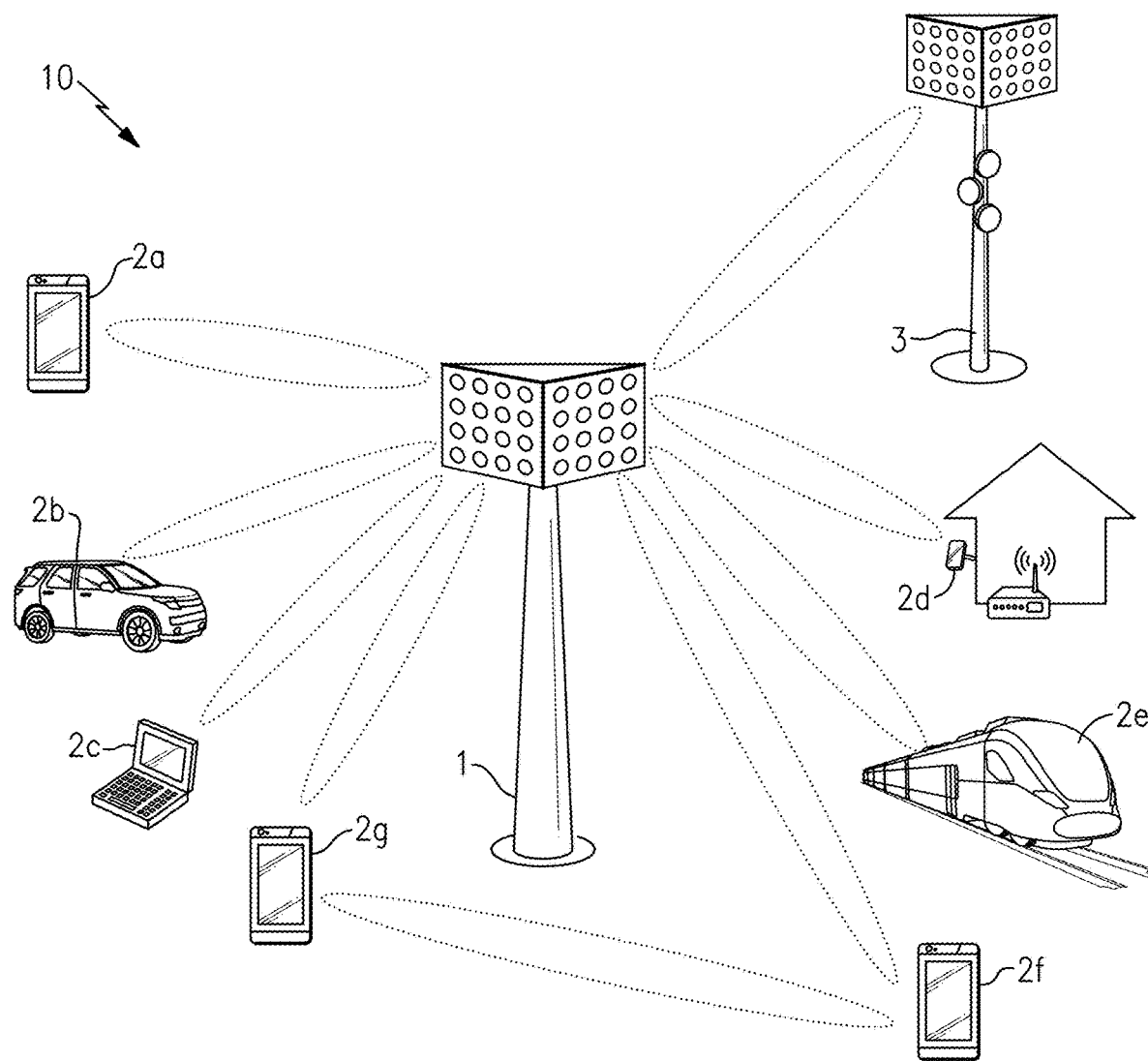
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
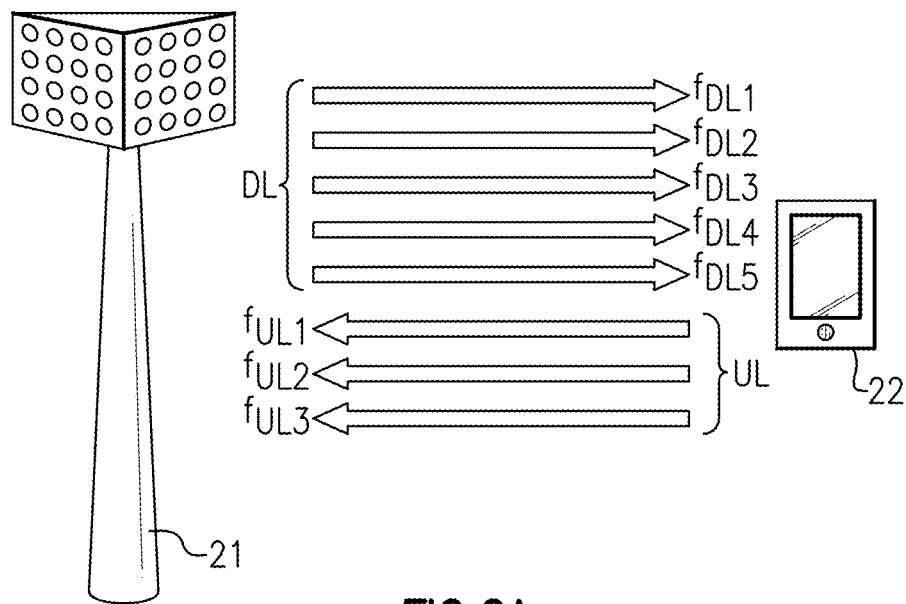
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
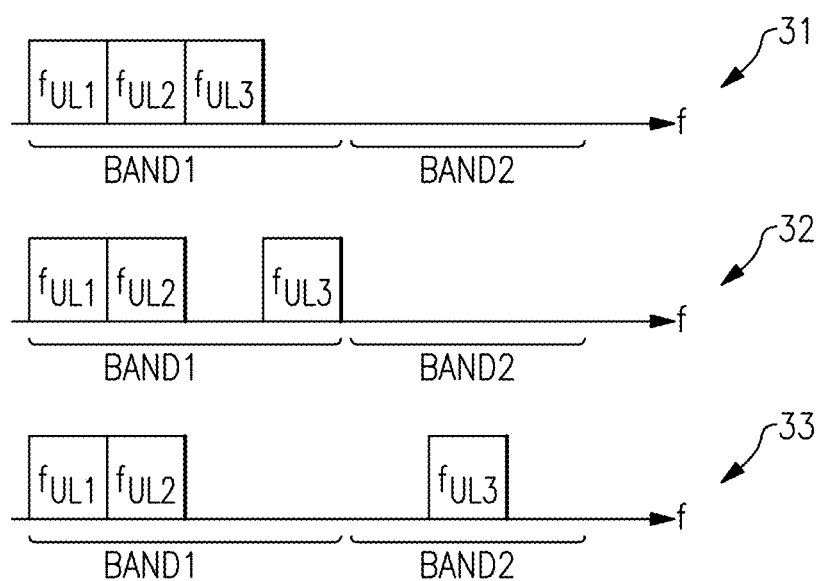
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
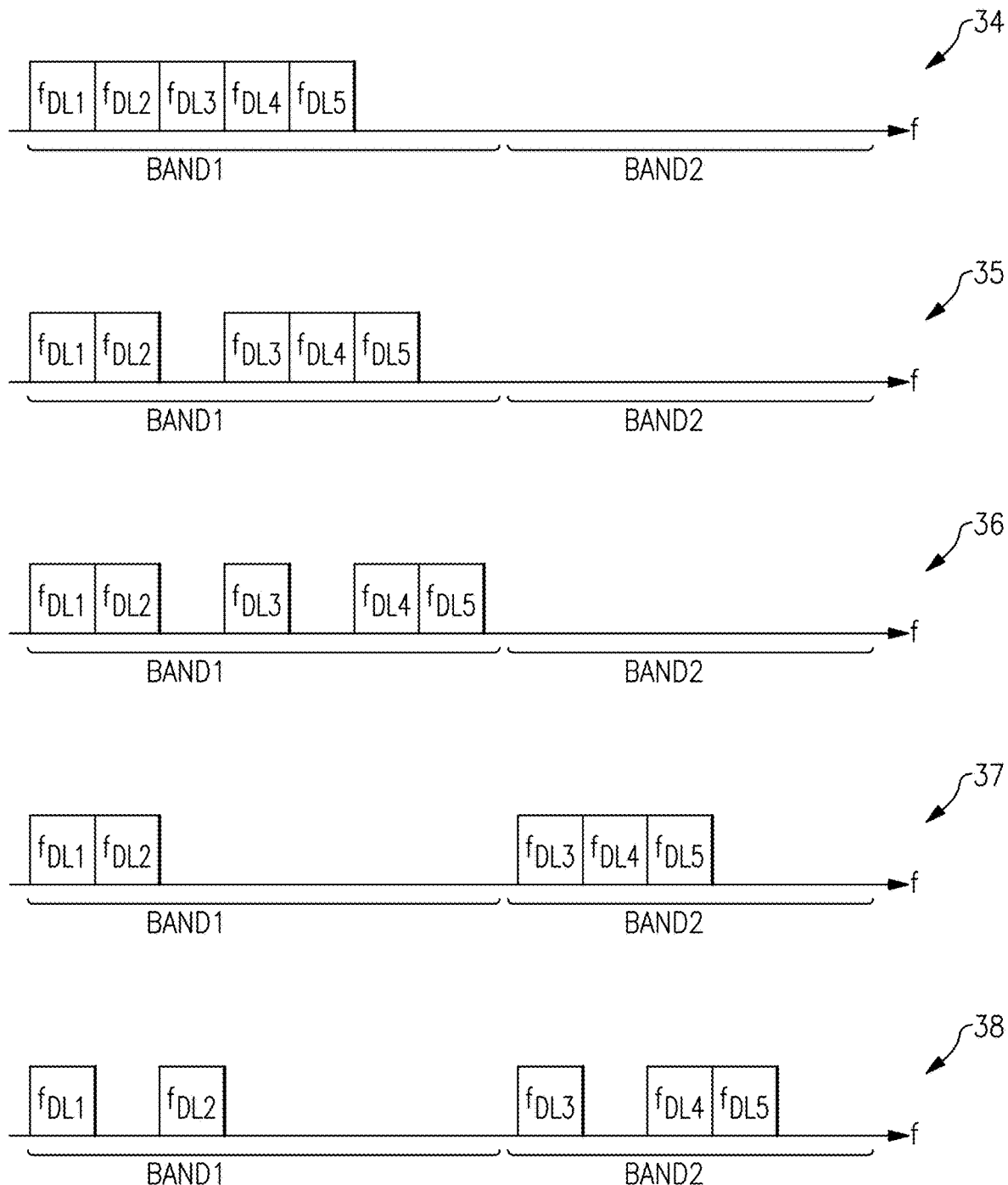
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
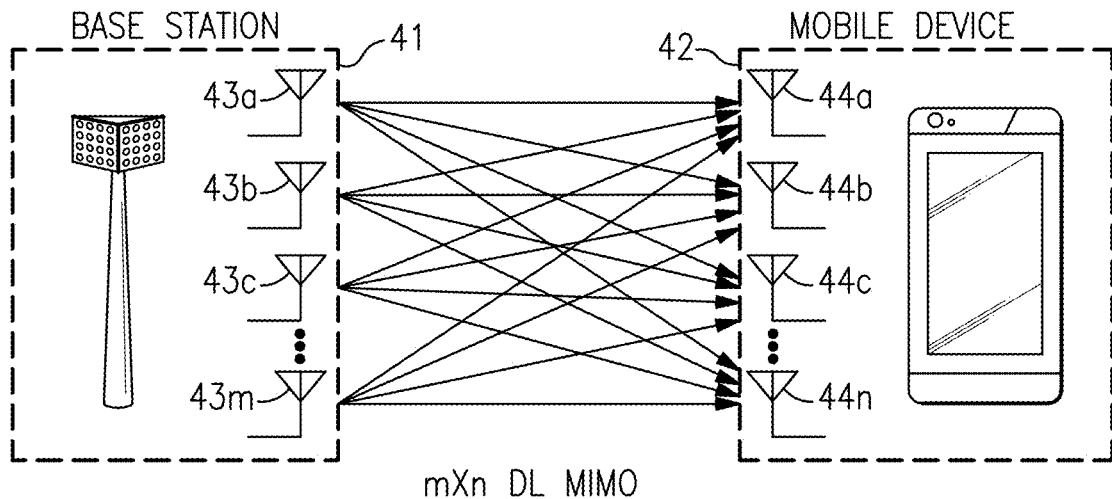
FIG. 3A is a schematic diagram of one example of a downlink channel using multi-input and multi-output (MIMO) communications.
Figure 3B:
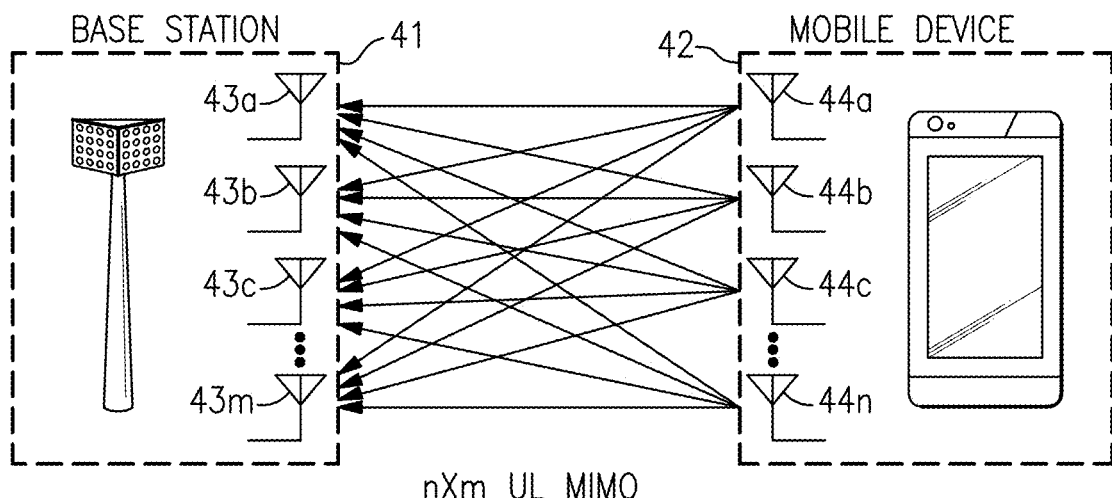
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, . . . $43m$ of the base station $41$ and receiving using N antennas $44a$, $44b$, $44c$, . . . $44n$ of the mobile device $42$. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, . . . $44n$ of the mobile device $42$ and receiving using M antennas $43a$, $43b$, $43c$, . . . $43m$ of the base station $41$. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
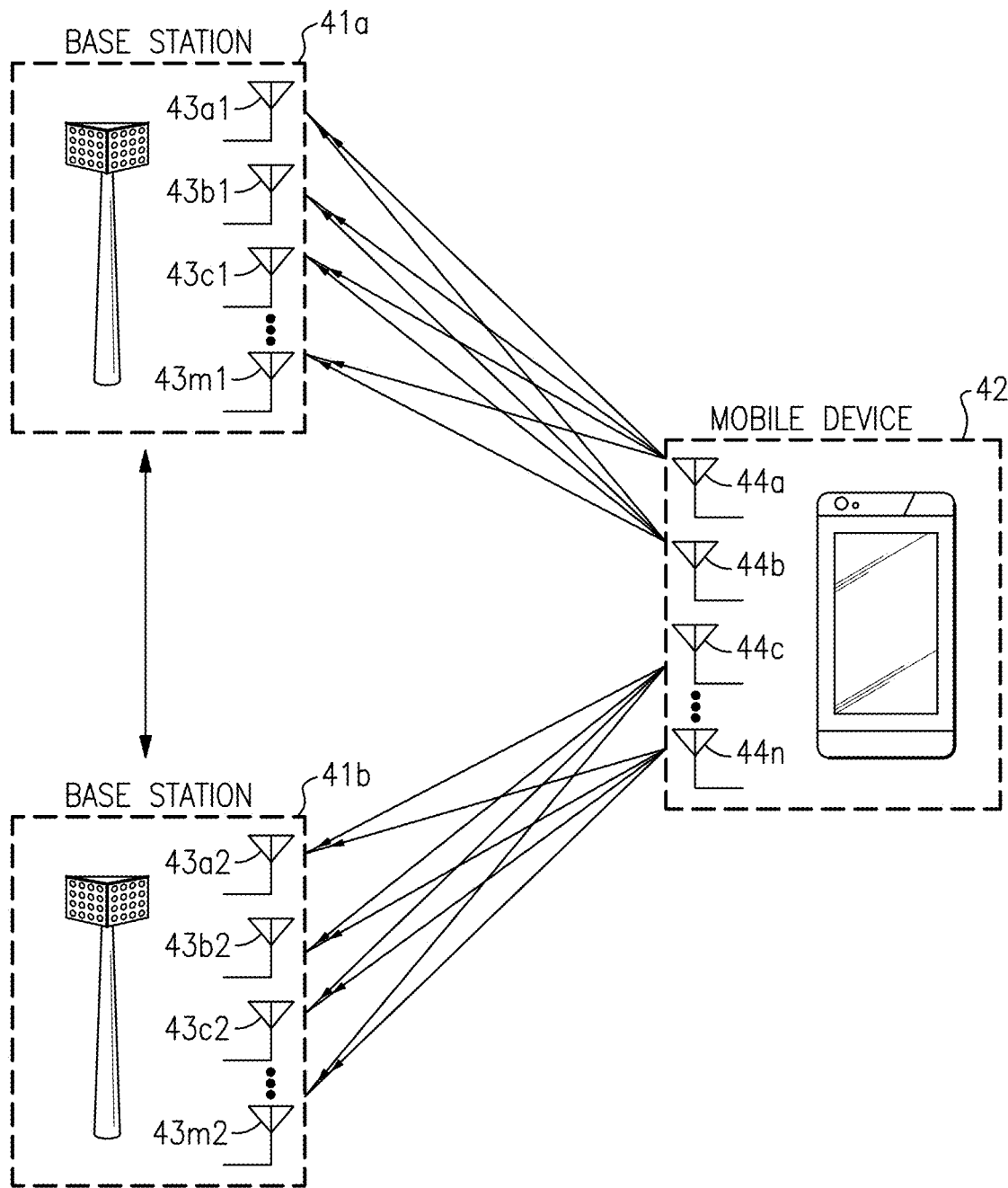
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, . . . $44n$ of the mobile device $42$. Additional a first portion of the uplink transmissions are received using M antennas $43a1$, $43b1$, $43c1$, . . . $43m1$ of a first base station $41a$, while a second portion of the uplink transmissions are received using M antennas $43a2$, $43b2$, $43c2$, . . . $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
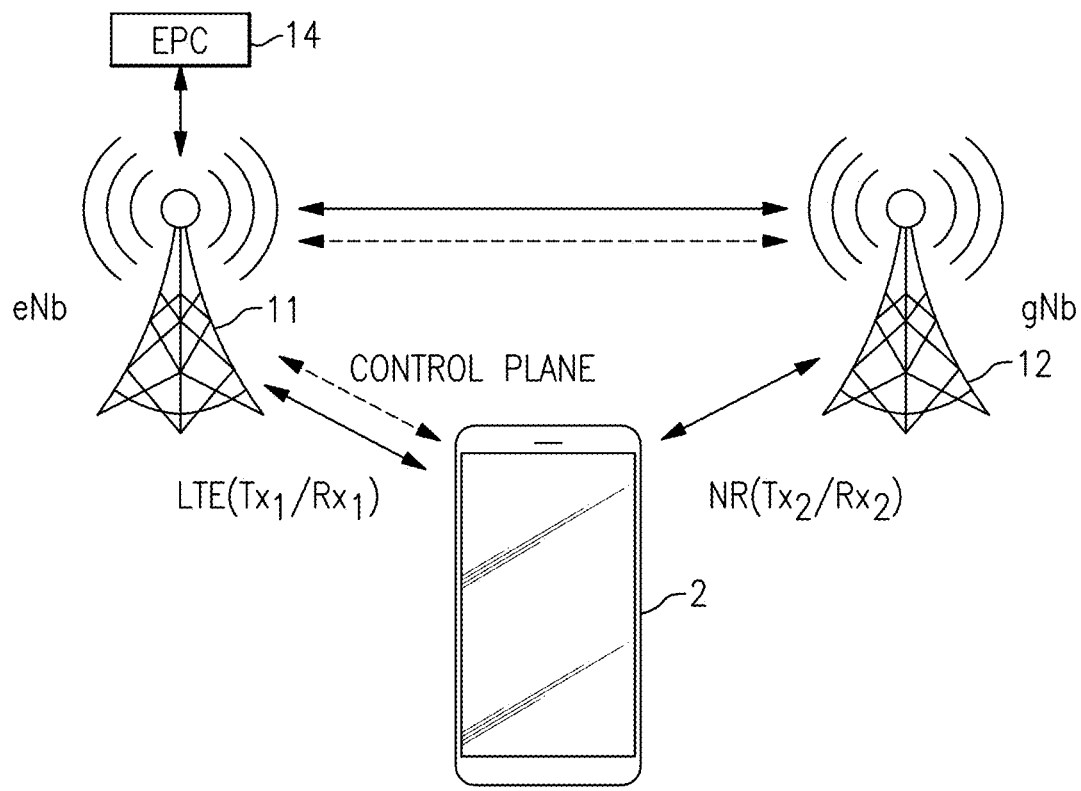
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Examples of Power Amplifier Signal Limiting Architectures for Cellular UE

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function (also referred to as antenna swap) to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal to noise ratio, improved coding, and/or reduced signal interference due to spatial multiplexing differences of the radio environment. MIMO order refers to a number of separate data streams sent or received.

A power amplifier can receive high power RF input signals under certain conditions. For example, a customer ruggedness specification can include a test case in which a power amplifier is driven with a large RF input signal, for instance, +10 dBm modulated RF input power over variation in voltage standing wave ratio (VSWR) and temperature.

Although a power amplifier and a downstream filter (for instance, an acoustic wave filter) can be implemented for handling VSWR and temperature variation under normal signaling conditions (for instance, transmitting at a maximum MPRO power), the power amplifier and/or downstream filter can be damaged under such a test case and/or other excess RF input signal drive event. For example, a downstream bulk acoustic wave (BAW) or surface acoustic wave (SAW) filter may be damaged at a certain threshold over MPRO power (for instance, 3.5 dB higher than maximum rated MPRO power).

Apparatus and methods for signal limiting of a power amplifier are provided. In certain embodiments, a power amplifier system includes a power amplifier that amplifies a radio frequency (RF) input signal generated during a transmit frame, and a signal limiter operable to limit a signal power of the power amplifier when the RF input signal exceeds a threshold. The signal limiter includes an RF detector that generates a detection signal based on detecting a power level of the RF input signal, and a latch that locks the signal limiter into an attenuating mode when the detection signal indicates that the threshold is exceeded. When the latch is locked, the signal limiter provides attenuation that limits the power of the power amplifier for a remainder of the transmit frame.

In certain implementations, the threshold is programmable, for instance, using a reference current source implemented with trimming. When the peaks of the RF input signal exceed the programmable threshold, the RF input signal is attenuated to a safe level for the rest of the frame. Moreover, the reference current source can be implemented with a desired temperature dependence, for instance, a positive temperature coefficient (TC) to provide compensation for power amplifier characteristics that vary with temperature. For example, it can be desirable to provide attenuation at a lower threshold when the power amplifier is operating at a low temperature.

By implementing the power amplifier with such signal limiting, improved ruggedness for worst case conditions (in which power and efficiency are typically not specified) is archived without incurring degradation in power, efficiency, and/or gain at nominal conditions. Furthermore, such signal limiting protects downstream or post-power amplifier circuitry such as acoustic wave filters. Moreover, the signal limiters herein can have low capacitance (thus providing low parasitic loading and little to no corresponding performance degradation at nominal conditions), fast response time (for instance, less than 10 microseconds), and/or serve to reduce both peak power and root mean square (RMS) power during an excess RF input signal drive event.

Figure 5A:
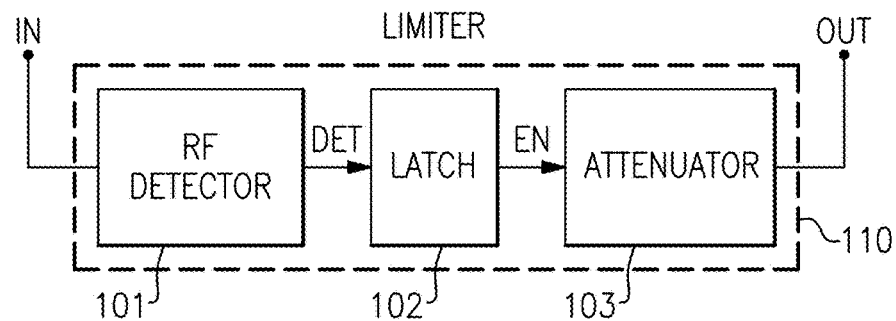
FIG. 5A is a schematic diagram of one embodiment of a signal limiter for a power amplifier.

FIG. 5A is a schematic diagram of one embodiment of a signal limiter 110 for a power amplifier. The signal limiter 110 includes an input IN for connecting to an RF signal detection point along a signal path of the power amplifier, and an output for connecting to an attenuation point along the signal path. The signal limiter 110 includes an RF detector 101, a latch 102, and an attenuator 103.

In the illustrated embodiment, the RF detector 101 generates a detection signal DET based on comparing the RF input signal level detected at the input IN to a threshold. When the RF input signal level exceeds the threshold, the detection signal DET is activated to trigger the latch 102.

The latch 102 uses the detection signal DET to control the attenuator 103 to set a mode of operation of the signal limiter 110. The latch 102 is operable in an unlatched state (or unlocked mode) in which the signal limiter 110 provides little to no attenuation. The latch 102 is also operable in a latched state (or locked mode) in which the signal limiter 110 provides attenuation or signal limiting.

As shown in FIG. 5A, the latch 102 generates an enable signal EN for selectively enabling the attenuator 103 to provide attenuation at the output OUT.

Figures 5B, 5C, 5D:
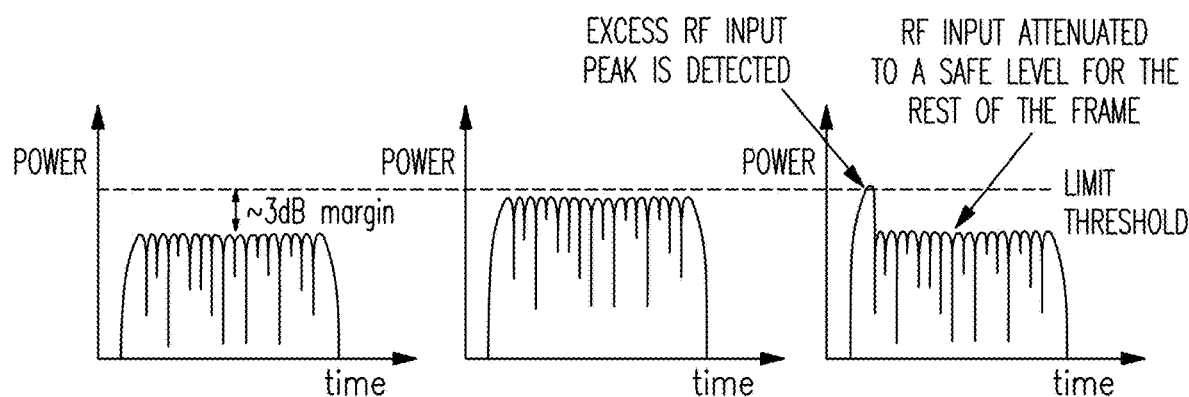
FIG. 5B is a first example of signal conditions for a power amplifier protected by the signal limiter of FIG. 5A.
FIG. 5C is a second example of signal conditions for a power amplifier protected by the signal limiter of FIG. 5A.
FIG. 5D is a third example of signal conditions for a power amplifier protected by the signal limiter of FIG. 5A.

FIG. 5B is a first example of signal conditions for a power amplifier protected by the signal limiter of FIG. 5A. In this example, the RF input signal is operating with normal signaling conditions over a transmit frame and with a margin (3 dB, in this example) below the threshold of the signal attenuator.

FIG. 5C is a second example of signal conditions for a power amplifier protected by the signal limiter 110 of FIG. 5A. In this example, the RF input signal is operating with signaling conditions above nominal but below the threshold of the signal limiter 110 and at which the power amplifier and/or downstream circuitry is susceptible to damage.

FIG. 5D is a third example of signal conditions for a power amplifier protected by the signal limiter 110 of FIG. 5A. In this example, the RF input signal is operating with input overdrive signaling conditions, such as those associated with a ruggedness test. Once the threshold of the signal limiter 110 is exceeded, the signal limiter 110 provides attenuation for a remainder of the transmit frame.

Figure 6A:
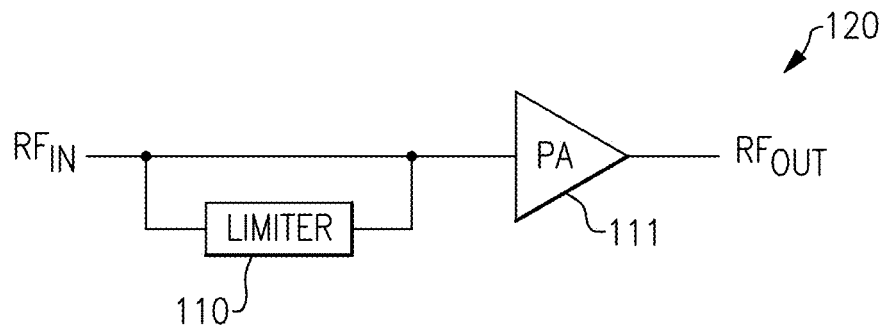
FIG. 6A is a schematic diagram of a power amplifier system with signal limiting according to one embodiment.

FIG. 6A is a schematic diagram of a power amplifier system 120 with signal limiting according to one embodiment. The power amplifier system 120 includes a signal limiter 110 and a power amplifier 111. The power amplifier 111 amplifies an RF input signal $RF_{IN}$ to generate an RF output signal $RF_{OUT}$.

In the illustrated embodiment, both an input and an output of the signal limiter 110 are connected to an input of the power amplifier 111.

Figure 6B:
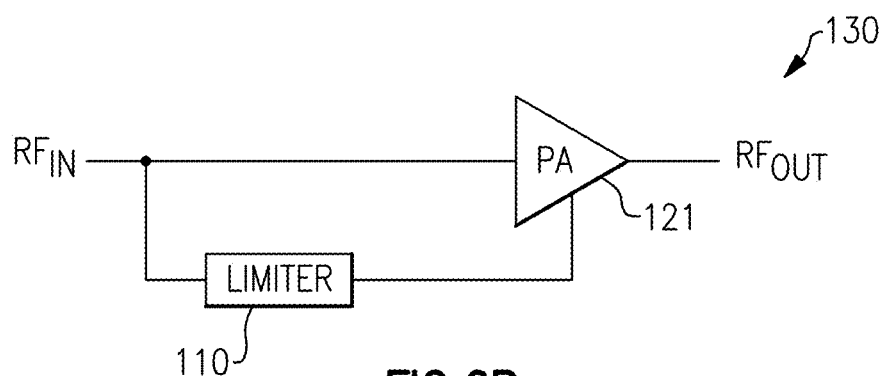
FIG. 6B is a schematic diagram of a power amplifier system with signal limiting according to another embodiment.

FIG. 6B is a schematic diagram of a power amplifier system 130 with signal limiting according to another embodiment. The power amplifier system 130 includes a signal limiter 110 and a power amplifier 121. The power amplifier 121 amplifies an RF input signal $RF_{IN}$ to generate an RF output signal $RF_{OUT}$.

In the illustrated embodiment, an input of the signal limiter 110 is connected to an input of the power amplifier 121, while an output of the signal limiter 110 is connected to an internal node of the power amplifier 121. The internal node can correspond to a portion of the signal path through the amplifier or to another suitable node, such as bias or control node (or instance, a node for enabling or disabling the power amplifier 121).

Figure 6C:
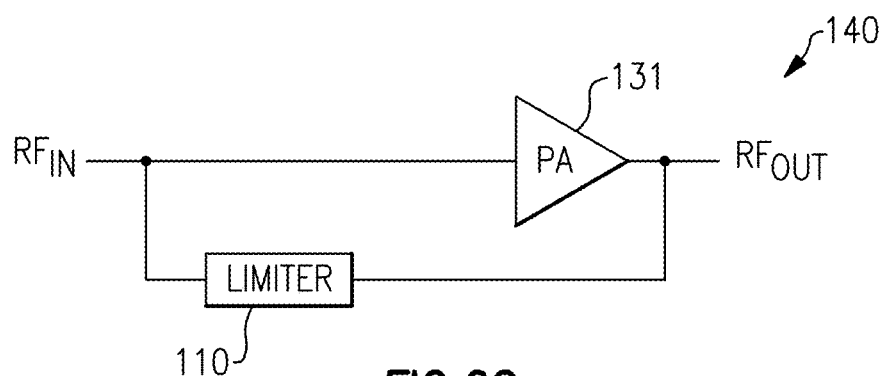
FIG. 6C is a schematic diagram of a power amplifier system with signal limiting according to another embodiment.

FIG. 6C is a schematic diagram of a power amplifier system 140 with signal limiting according to another embodiment. The power amplifier system 140 includes a signal limiter 110 and a power amplifier 131. The power amplifier 131 amplifies an RF input signal $RF_{IN}$ to generate an RF output signal $RF_{OUT}$.

In the illustrated embodiment, an input of the signal limiter 110 is connected to an input of the power amplifier 131, while an output of the signal limiter 110 is connected to output of the power amplifier 131.

Figure 6D:
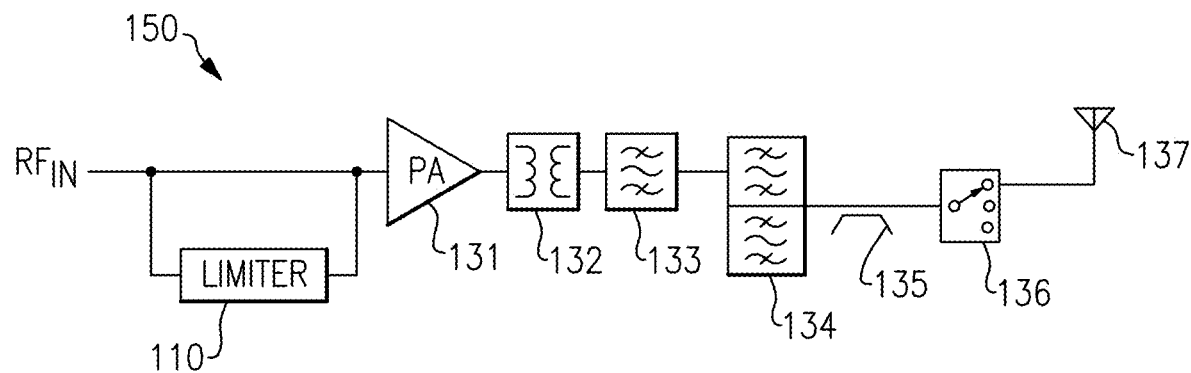
FIG. 6D is a schematic diagram of a power amplifier system with signal limiting according to another embodiment.

FIG. 6D is a schematic diagram of a power amplifier system 140 with signal limiting according to another embodiment. The power amplifier system 140 includes a signal limiter 110 and a power amplifier 131 connected using the configuration of FIG. 6A. Although shown in connection with the configuration of FIG. 6A, the power amplifier system 140 can be connected in other ways, for instance, using the configurations of FIG. 6B or 6C.

The power amplifier system 140 further includes an impedance transformer 132 (for example, a balun), an acoustic wave filter 133 (for example, a BAW filter or SAW filter), a diplexer 134, a coupler 135, a switch 136, and an antenna 137. The impedance transformer 132, the acoustic wave filter 133, the diplexer 134, the coupler 135, and the switch 136 are connected in cascade between an output of the power amplifier 131 and the antenna 137.

The power amplifier system 140 is implemented with an example of downstream components of the power amplifier 131. Absent protection for input overdrive conditions, one or more of the components shown in FIG. 6D can be damaged.

Figure 7:
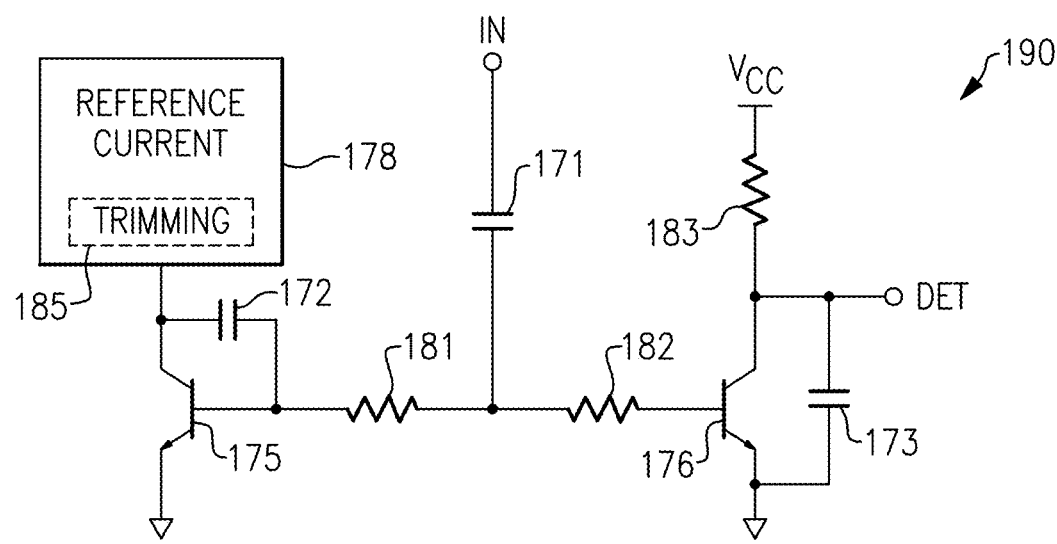
FIG. 7 is a schematic diagram of one embodiment of a radio frequency (RF) detector for a signal limiter.

FIG. 7 is a schematic diagram of one embodiment of an RF detector 190 for a signal limiter. The RF detector 190 includes an input capacitor 171, a base-to-collector capacitor 172, an output capacitor 173, a first detection transistor 175, a second detection transistor 176, a reference current source 178, a first base resistor 181, a second base resistor 182, and an output resistor 183.

The RF detector 190 includes an input IN for detecting an RF input signal level. The RF input signal level is coupled into the bases of the first detection transistor 175 and the second detection transistor 176 to compare the RF input signal level to a threshold set by the reference current source 178. When the RF input signal level exceeds the threshold, a detection signal at a detection output DET is activated.

The reference current source 178 can be implemented with programmability and/or a temperature coefficient to achieve desired performance. For example, the illustrated embodiment the reference current source 178 can be trimmed using a trimming circuit 185.

Figure 8A:
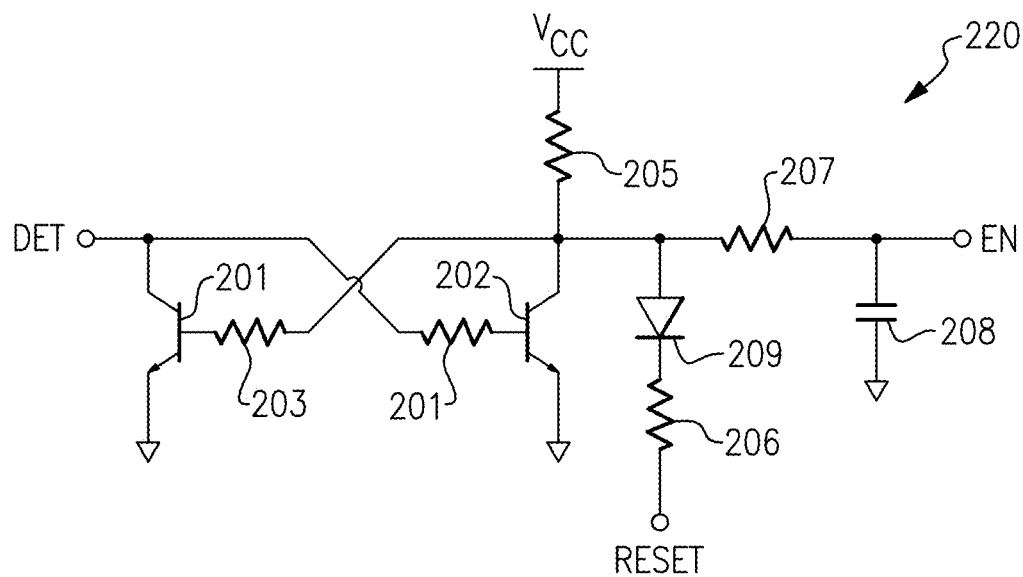
FIG. 8A is a schematic diagram of one embodiment of a latch for a signal limiter.

FIG. 8A is a schematic diagram of one embodiment of a latch 220 for a signal limiter. The latch 220 includes a first latching transistor 201, a second latching transistor 202, a first latch resistor 203, a second latch resistor 204, a pull-up resistor 205, a reset resistor 206, an output resistor 207, an output capacitor 208, and a reset diode 209.

The first latching transistor 201 and the second latching transistor 202 are cross-coupled and selectively latched by the detection signal DET. When latched, the enable signal at the enable output EN is activated. The latch 220 is resettable using the reset input RESET.

Figure 8B:
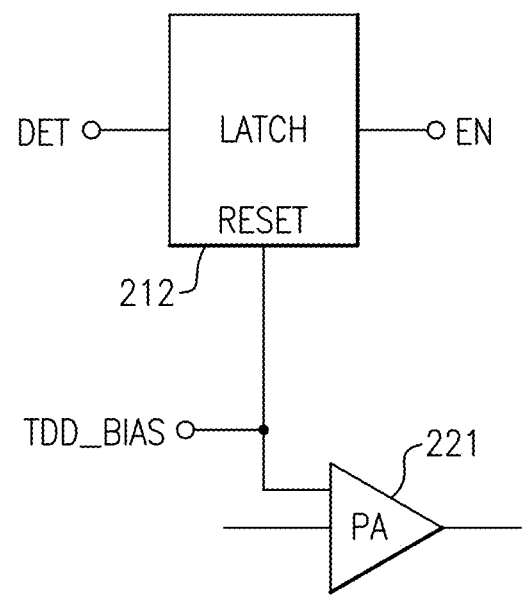
FIG. 8B is a schematic diagram of one embodiment of reset scheme for a latch of a signal limiter.

FIG. 8B is a schematic diagram of one embodiment of reset scheme for a latch 212 of a signal limiter. As shown in FIG. 8B, the reset input RESET to the latch 212 is controlled by a time division duplexing (TDD) bias signal TDD_BIAS of a power amplifier 221.

In this embodiment, the power amplifier 221 operates in a communication system that uses TDD in which the power amplifier 221 is enabled and transmits during a transmit frame and is disabled during a receive frame. The power amplifier 211 is biased using the bias signal TDD_BIAS which activates the power amplifier 221 during the transmit frame and disables the power amplifier 221 during the receive frame. The bias signal TDD_BIAS is also used to reset the latch 212. Thus, the latch 212 is reset during a receive frame, in this example.

Figure 9A:
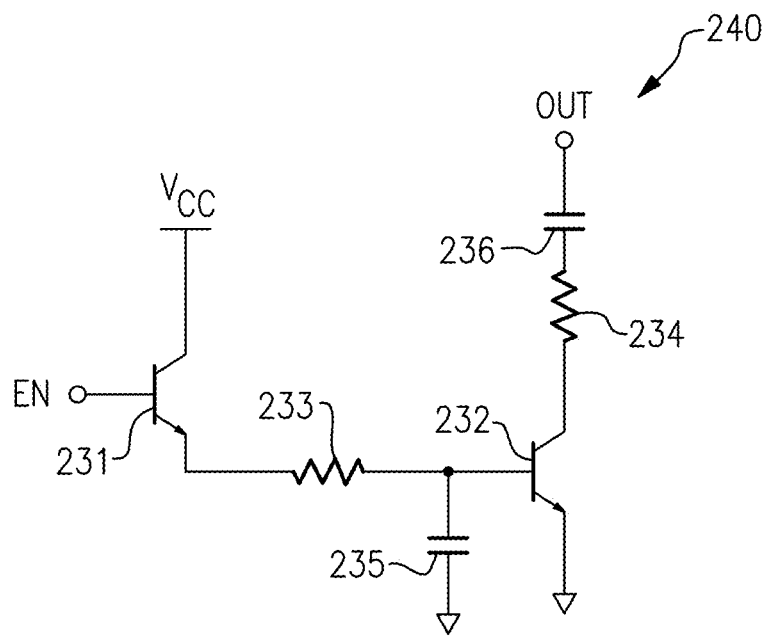
FIG. 9A is a schematic diagram of one embodiment of an attenuator for a signal limiter.

FIG. 9A is a schematic diagram of one embodiment of an attenuator 240 for a signal limiter. The attenuator 240 includes an input transistor 231, an attenuation transistor 232, a filter resistor 233, an output resistor 234, a filter capacitor 235, and an output capacitor 236.

When the attenuator enable signal received at the enable input EN is activated, the attenuator 240 provides attenuation at the output OUT. For example, the RF path through the output capacitor 236, the output resistor 234, and the attenuation transistor 232 serve to provide attenuation to an RF signal present at the output OUT.

Figure 9B:
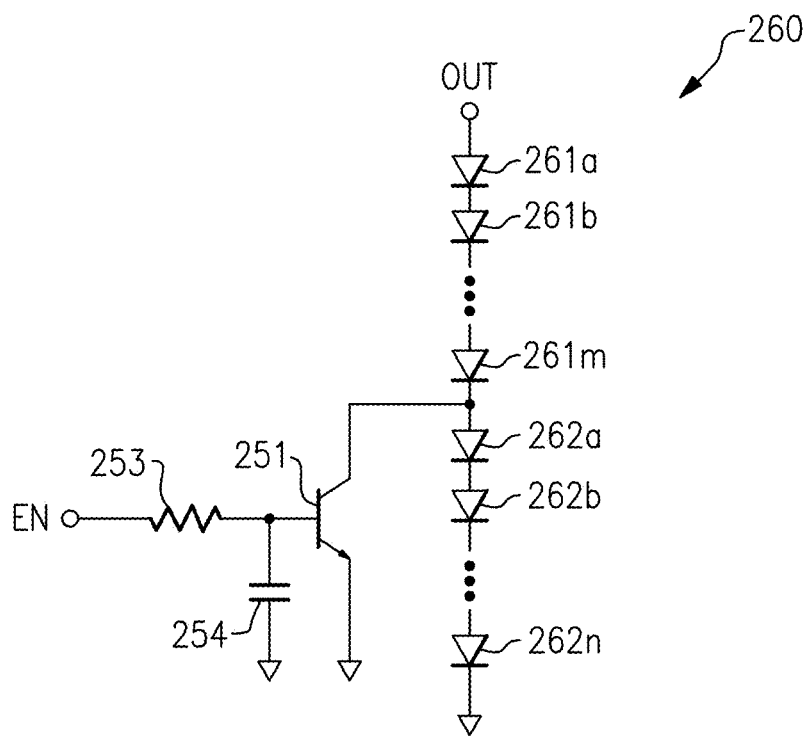
FIG. 9B is a schematic diagram of another embodiment of an attenuator for a signal limiter.

FIG. 9B is a schematic diagram of another embodiment of an attenuator 260 for a signal limiter. The attenuator 260 includes an attenuation transistor 251, an input resistor 253, an input capacitor 254, a first group of series diodes 261a, 261b, . . . 261m, and a second group of series diodes 262a, 262b, . . . 262n.

In this embodiment, when the attenuator enable signal received at the enable input EN is activated, the amount of attenuation provided by the attenuator 260 is increased by reducing a number of diodes in series between the output OUT and ground. For example, the second group of series diodes 262a, 262b, . . . 262n are bypassed when the enable signal is activated.

Figure 10A:
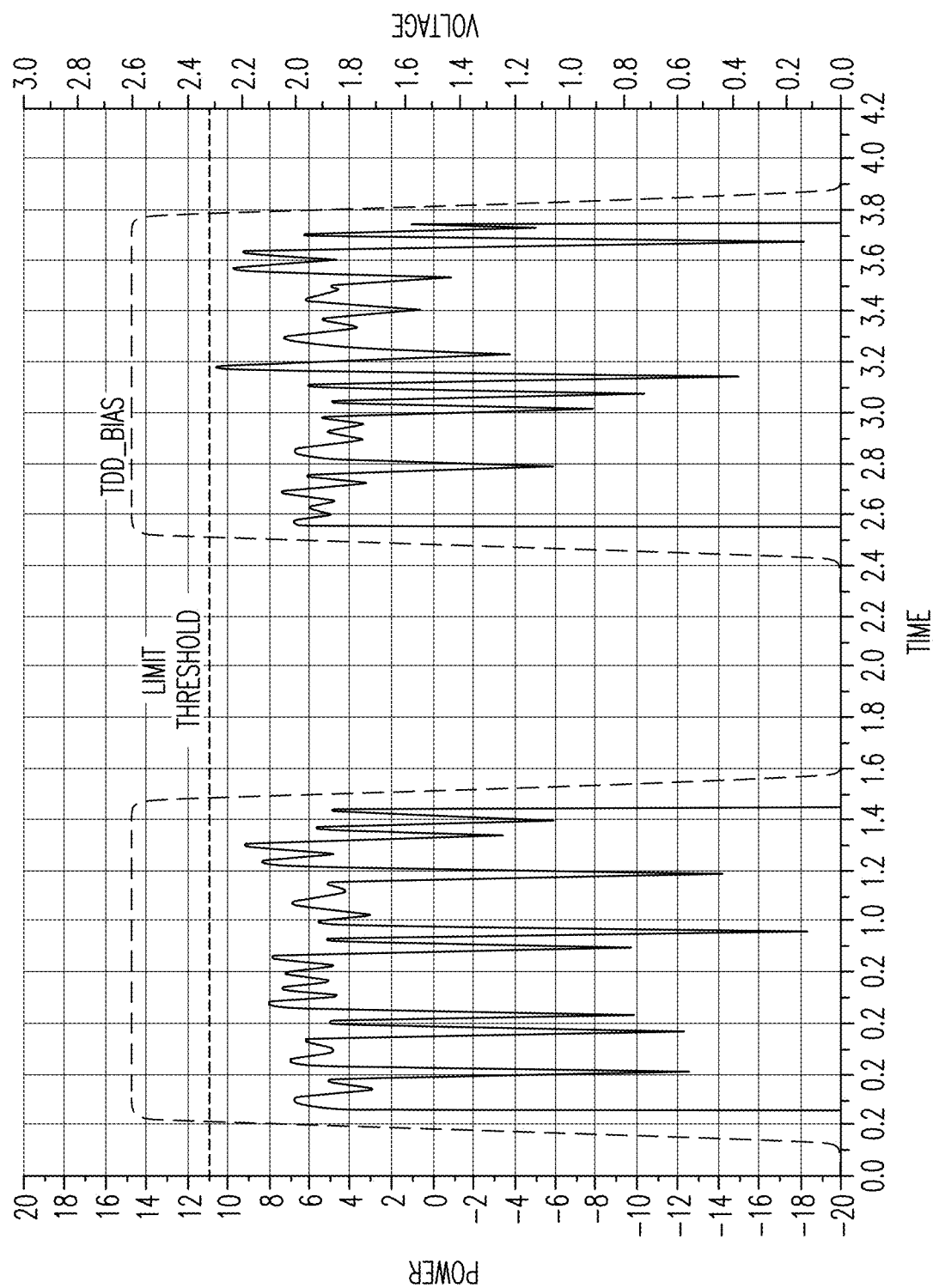
FIG. 10A is a graph of one example of signal limiting simulations for a power amplifier.

FIG. 10A is a graph of one example of signal limiting simulations for a power amplifier. Two transmit frames are depicted in the example graph of FIG. 10A. In this example, the RF input signal level is below the threshold, and thus signal limiting is not provided.

Figure 10B:
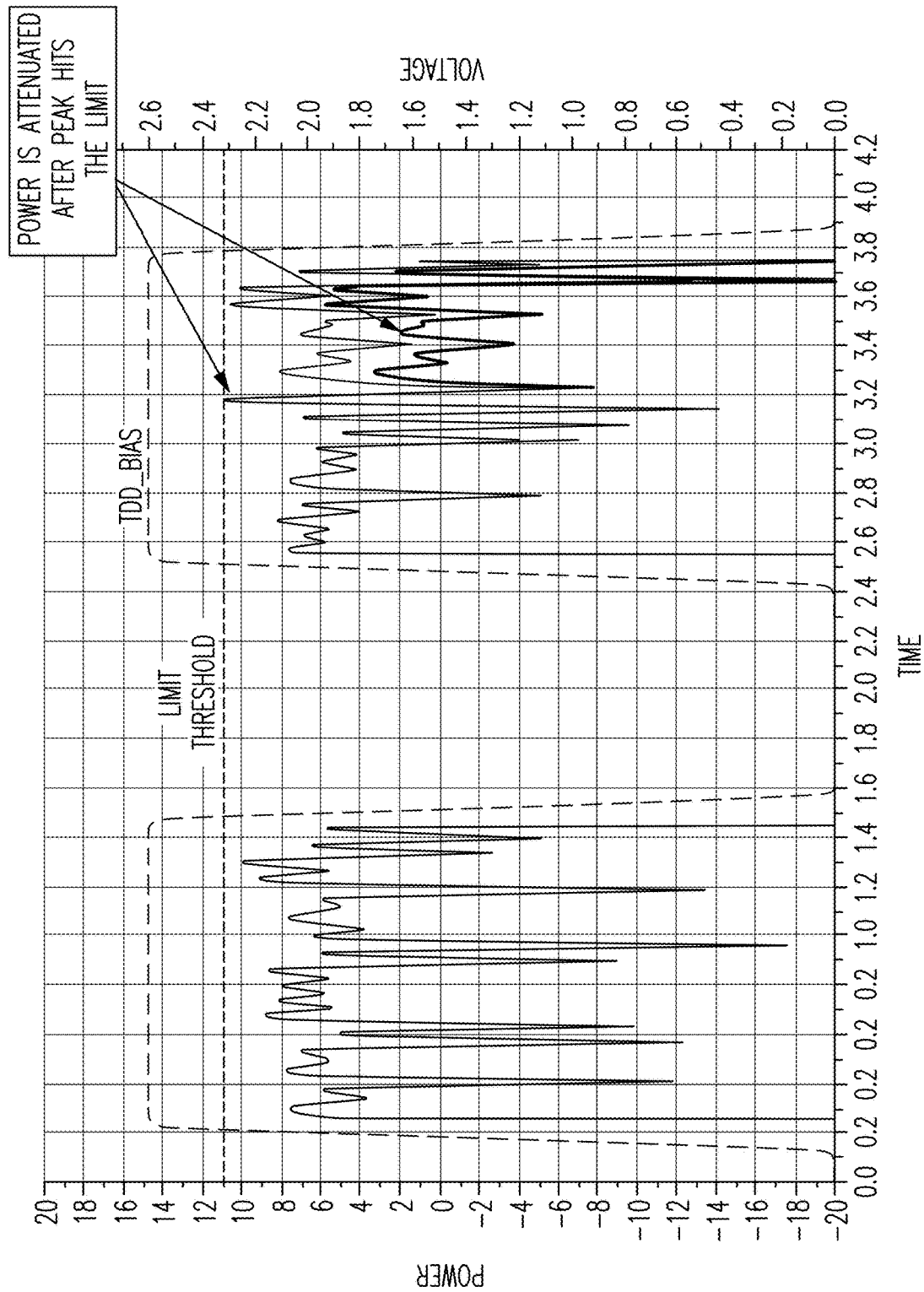
FIG. 10B is a graph of another example of signal limiting simulations for a power amplifier.

FIG. 10B is a graph of another example of signal limiting simulations for a power amplifier. Two transmit frames are depicted in the example graph of FIG. 10B. In this example, the RF input signal level is below the threshold for the first transmit frame, and thus signal limiting is not provided for the first transmit frame. However, for the second transmit frame, the RF input signal level exceeds the threshold and signal limiting is provided for a remainder of the second transmit frame.

Figure 11:
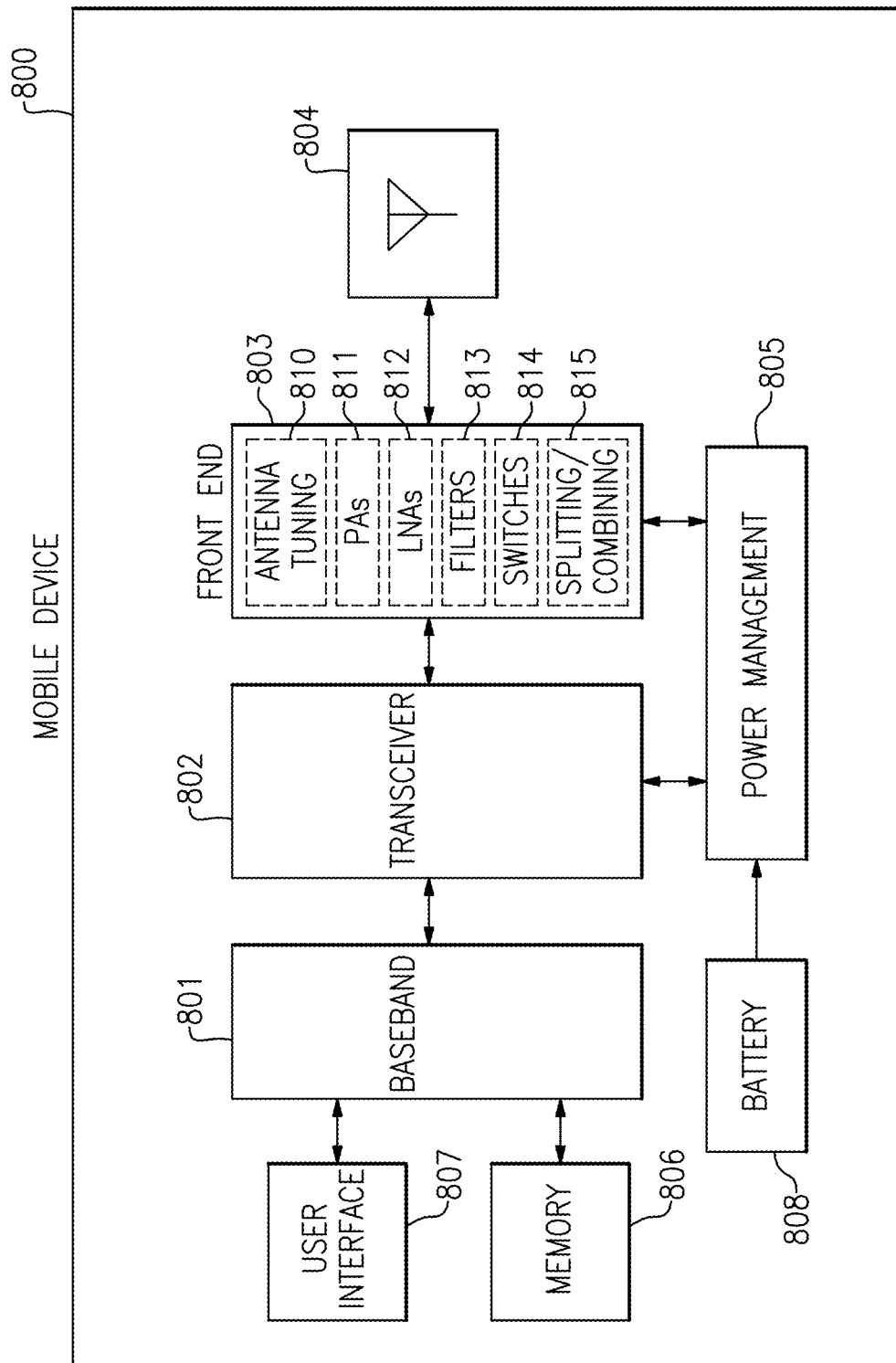
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is implemented with signal limiting in accordance with the teachings herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Figure 12:
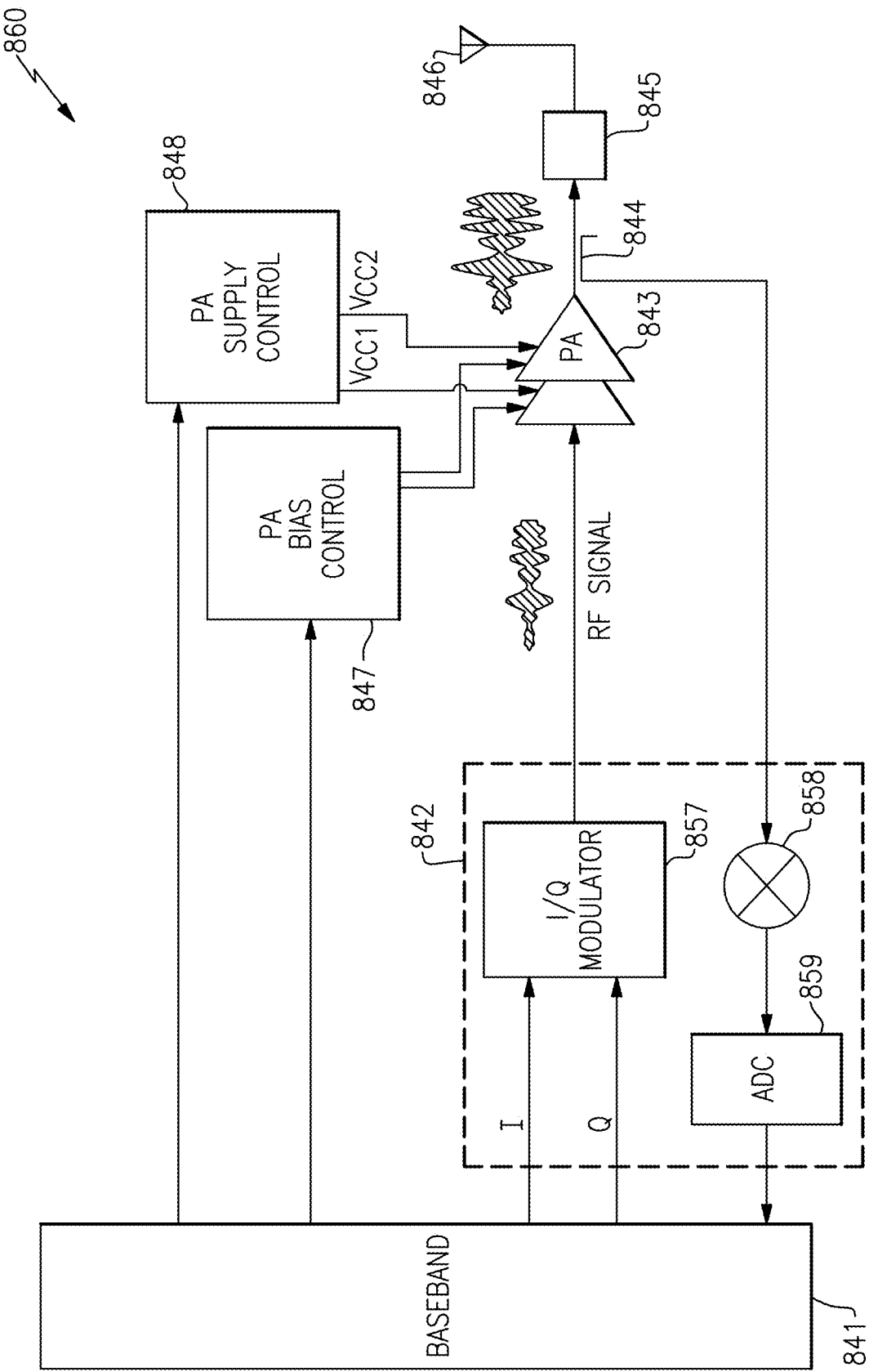
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented with signal limiting in accordance with any of the embodiments herein.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Applications

Some of the embodiments described above have provided examples in connection with mobile devices. However, the principles and advantages of the embodiments can be used for any other systems or apparatus that have needs for power amplifiers with signal limiting. Examples of such systems and apparatus include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency input signal; and
a front-end system including a power amplifier configured to amplify the radio frequency input signal, and a signal limiter operable to limit a signal power of the power amplifier when the radio frequency input signal exceeds a threshold, the signal limiter including a radio frequency detector configured to generate a detection signal based on detecting a power level of the radio frequency input signal, and a latch configured to lock the signal limiter into an attenuating mode in response to the detection signal indicating that the threshold is exceeded, the signal limiter including an input connected to an input of the power amplifier and an output connected to an output of the power amplifier, the signal limiter further including an attenuator including a plurality of diodes connected in series between the output of the power amplifier and ground, the plurality of diodes including one or more selectable diodes that are bypassed in the attenuation mode.

2. The mobile device of claim 1 wherein the transceiver is configured to generate the radio frequency input signal during a transmit frame, and in response to the detection signal indicating that the threshold is exceeded the latch is operable to lock the signal limiter into the attenuation mode for a remainder of the transmit frame.

3. The mobile device of claim 2 wherein the power amplifier is biased by a bias signal that is activated during the transmit frame and deactivated during a receive frame, the latch selectively reset by the bias signal.

4. The mobile device of claim 1 wherein the front-end system further includes an acoustic wave filter configured to filter a radio frequency output signal from the power amplifier, the acoustic wave filter protected by the signal limiter.

5. The mobile device of claim 1 wherein the radio frequency detector includes a reference current source configured to generate a reference current that sets the threshold.

6. The mobile device of claim 5 wherein the reference current source includes a trimming circuit operable to trim the reference current.

7. The mobile device of claim 5 wherein the reference current source is configured to generate the reference current with a positive temperature coefficient.

8. A method of signal limiting in a mobile device, the method comprising:
generating a radio frequency input signal using a transceiver;
amplifying the radio frequency input signal using a power amplifier; and
limiting a signal power of the power amplifier when the radio frequency input signal exceeds a threshold using a signal limiter, including generating a detection signal based on detecting a power level of the radio frequency input signal using a radio frequency detector of the signal limiter, and locking the signal limiter into an attenuating mode in response to the detection signal indicating that the threshold is exceeded using a latch of the signal limiter;
biasing the power amplifier with a bias signal that is activated during a transmit frame and deactivated during a receive frame; and
selectively resetting the latch with the bias signal.

9. The method of claim 8 further comprising generating the radio frequency input signal during the transmit frame, and locking the signal limiter into the attenuation mode for a remainder of the transmit frame in response to the detection signal indicating that the threshold is exceeded.

10. The method of claim 8 further comprising filtering a radio frequency output signal from the power amplifier using an acoustic wave filter, and protecting the acoustic wave filter using the signal limiter.

11. The method of claim 8 further comprising generating a reference current that sets the threshold using a reference current source of the radio frequency detector.

12. The method of claim 11 further comprising trimming the reference current using a trimming circuit.

13. The method of claim 11 further comprising generating the reference current with a positive temperature coefficient using the reference current source.

14. A power amplifier system comprising:
a power amplifier configured to amplify a radio frequency input signal, the power amplifier biased by a bias signal; and
a signal limiter operable to limit a signal power of the power amplifier when the radio frequency input signal exceeds a threshold, the signal limiter including a radio frequency detector configured to generate a detection signal based on detecting a power level of the radio frequency input signal, and a latch configured to lock the signal limiter into an attenuating mode in response to the detection signal indicating that the threshold is exceeded, the latch selectively reset by the bias signal.

15. The power amplifier system of claim 14 wherein an input and an output of the signal limiter are both connected to an input of the power amplifier.

16. The power amplifier system of claim 14 wherein an input of the signal limiter is connected to an input of the power amplifier and an output of the signal limiter is connected to an output of the power amplifier.

17. The power amplifier system of claim 14 wherein the radio frequency detector includes a reference current source configured to generate a reference current that sets the threshold.

18. The power amplifier system of claim 17 wherein the reference current source includes a trimming circuit operable to trim the reference current.

19. The power amplifier system of claim 17 wherein the reference current source is configured to generate the reference current with a positive temperature coefficient.

20. The power amplifier system of claim 14 further comprising an acoustic wave filter configured to filter a radio frequency output signal from the power amplifier, the acoustic wave filter protected by the signal limiter.

* * * * *